(12) United States Patent
Gogoi et al.

(10) Patent No.: US 9,799,627 B2
(45) Date of Patent: Oct. 24, 2017

(54) SEMICONDUCTOR PACKAGE STRUCTURE AND METHOD

(71) Applicant: Semiconductor Components Industries, LLC, Phoenix, AZ (US)

(72) Inventors: Bishnu Prasanna Gogoi, Scottsdale, AZ (US); Robert Bruce Davies, Tempe, AZ (US); Phuong Le, Goodyear, AZ (US); Alexander J. Elliott, Tempe, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 446 days.

(21) Appl. No.: 13/745,072

(22) Filed: Jan. 18, 2013

(65) Prior Publication Data

US 2014/0035114 A1   Feb. 6, 2014

Related U.S. Application Data

(60) Provisional application No. 61/588,375, filed on Jan. 19, 2012.

(51) Int. Cl.
*H01L 25/065* (2006.01)
*H01L 23/13* (2006.01)
(Continued)

(52) U.S. Cl.
CPC .......... *H01L 25/0652* (2013.01); *H01L 23/13* (2013.01); *H01L 23/142* (2013.01);
(Continued)

(58) Field of Classification Search
CPC . H01L 2224/32225; H01L 2224/73265; H01L 2224/48227; H01L 2224/16225; H01L 2224/97; H01L 2224/32145; H01L 2224/32221; H01L 2224/73257; H01L 2224/32135; H01L 2224/73253; H01L 2924/19105; H01L 2924/19041; H01L 2924/14; H01L 2924/15153; H01L 2924/19042; H01L 2924/19043; H01L 2924/19011; H01L 2924/19015; H01L 2924/1902; H01L 2924/19107; H01L 2924/19103; H01L 2924/3011; H01L 25/50; H01L 25/0657; H01L 25/0652; H01L 25/0655; H01L 24/19; H01L 2224/48091; H01L 2224/73264;
(Continued)

(56) References Cited

U.S. PATENT DOCUMENTS 3,903,590 A * 9/1975 Yokogawa .................... 438/107
4,290,079 A * 9/1981 Carpenter et al. ............ 257/780
(Continued)

*Primary Examiner* — Sophia Nguyen
(74) *Attorney, Agent, or Firm* — Kevin B. Jackson

(57) ABSTRACT

In one embodiment, a semiconductor package structure includes a substrate having a well region extending from a major surface. An interposer structure is attached to the substrate within the well region. The interposer structure has a major surface that is substantially co-planar with the major surface of the substrate. An electrical device is directly attached to the substrate and the interposer structure. The interposer structure can be an active device, such as a gate driver integrated circuit, or passive device structure, such as an impedance matching network.

25 Claims, 5 Drawing Sheets

(51) Int. Cl.
  *H01L 23/14* (2006.01)
  *H01L 25/07* (2006.01)
  *H01L 23/31* (2006.01)
  *H01L 23/60* (2006.01)
  *H01L 23/64* (2006.01)

(52) U.S. Cl.
  CPC ........ *H01L 25/072* (2013.01); *H01L 23/3121* (2013.01); *H01L 23/60* (2013.01); *H01L 23/64* (2013.01); *H01L 2224/48091* (2013.01); *H01L 2224/73257* (2013.01); *H01L 2224/73265* (2013.01); *H01L 2924/1301* (2013.01); *H01L 2924/1305* (2013.01); *H01L 2924/13091* (2013.01); *H01L 2924/181* (2013.01); *H01L 2924/3011* (2013.01); *H01L 2924/30107* (2013.01)

(58) Field of Classification Search
  CPC . H01L 2924/00014; H01L 2924/15165; H01L 2924/00; H01L 2924/3025; H01L 2924/30107; H01L 2924/1532; H01L 2924/15155; H01L 2224/24227; H01L 2224/82; H01L 2224/24137; H01L 2224/16227; H01L 2224/73204; H01L 2224/49171; H01L 2224/0401; H01L 2224/48145; H01L 2924/15311; H01L 23/3121; H01L 23/64; H01L 25/072
  See application file for complete search history.

(56) References Cited

U.S. PATENT DOCUMENTS

| | | | | |
|---|---|---|---|---|
| 4,744,008 A * | 5/1988 | Black et al. | | 361/717 |
| 5,049,978 A * | 9/1991 | Bates et al. | | 257/686 |
| 5,081,563 A * | 1/1992 | Feng et al. | | 361/795 |
| 5,198,963 A * | 3/1993 | Gupta et al. | | 361/715 |
| 5,565,706 A * | 10/1996 | Miura et al. | | 257/723 |
| 5,644,167 A * | 7/1997 | Weiler et al. | | 257/777 |
| 6,150,724 A * | 11/2000 | Wenzel | H01L 25/0657 | 257/724 |
| 6,160,311 A * | 12/2000 | Chen et al. | | 257/706 |
| 6,222,212 B1 * | 4/2001 | Lee et al. | | 257/207 |
| 6,480,385 B2 * | 11/2002 | Seshan | | 361/704 |
| 6,489,686 B2 * | 12/2002 | Farooq | H01L 24/11 | 257/686 |
| 6,512,302 B2 * | 1/2003 | Mess et al. | | 257/777 |
| 6,563,205 B1 * | 5/2003 | Fogal et al. | | 257/686 |
| 6,603,198 B2 * | 8/2003 | Akram et al. | | 257/686 |
| 6,832,356 B1 * | 12/2004 | Ochi | | 716/109 |
| 6,933,541 B1 * | 8/2005 | Huang | H01L 24/72 | 257/133 |
| 7,002,254 B2 * | 2/2006 | Harper | H01L 25/0657 | 257/723 |
| 7,098,542 B1 * | 8/2006 | Hoang | H01L 23/13 | 257/686 |
| 7,102,220 B2 * | 9/2006 | Stevens et al. | | 257/686 |
| 7,176,506 B2 * | 2/2007 | Beroz | H01F 17/0033 | 257/232 |
| 7,176,579 B2 * | 2/2007 | Konishi et al. | | 257/777 |
| 7,224,058 B2 * | 5/2007 | Fernandez | H01L 23/13 | 257/707 |
| 7,262,508 B2 * | 8/2007 | Kelly | H01L 23/13 | 257/686 |
| 7,894,199 B1 * | 2/2011 | Chang | | 361/760 |
| 8,030,743 B2 * | 10/2011 | Liu | H01L 23/3107 | 257/666 |
| 8,064,224 B2 * | 11/2011 | Mahajan et al. | | 361/809 |
| 8,164,185 B2 * | 4/2012 | Cho et al. | | 257/734 |
| 8,227,904 B2 * | 7/2012 | Braunisch et al. | | 257/686 |
| 8,288,854 B2 * | 10/2012 | Weng et al. | | 257/686 |
| 8,669,650 B2 * | 3/2014 | Zhang et al. | | 257/676 |
| 8,872,349 B2 * | 10/2014 | Chiu et al. | | 257/774 |
| 2002/0011659 A1 * | 1/2002 | Nishide et al. | | 257/702 |
| 2005/0142793 A1 * | 6/2005 | Choi | | 438/381 |
| 2006/0030115 A1 * | 2/2006 | Chung | | 438/381 |
| 2006/0197182 A1 * | 9/2006 | Degani et al. | | 257/531 |
| 2006/0226527 A1 * | 10/2006 | Hatano et al. | | 257/686 |
| 2008/0230889 A1 * | 9/2008 | Standing | H01L 23/492 | 257/693 |
| 2009/0127715 A1 * | 5/2009 | Shin et al. | | 257/777 |
| 2009/0174046 A1 * | 7/2009 | Liu | H01L 23/3107 | 257/676 |
| 2009/0218665 A1 * | 9/2009 | Yang | | 257/676 |
| 2009/0288907 A1 * | 11/2009 | Collier-Hallman | B62D 5/046 | 180/446 |
| 2010/0025836 A1 * | 2/2010 | Tay et al. | | 257/686 |
| 2011/0013349 A1 * | 1/2011 | Morikita et al. | | 361/679.02 |
| 2011/0089531 A1 * | 4/2011 | Hillman et al. | | 257/532 |
| 2011/0169163 A1 * | 7/2011 | Liou et al. | | 257/738 |
| 2011/0175222 A1 * | 7/2011 | Kim et al. | | 257/738 |
| 2012/0235309 A1 * | 9/2012 | Essig et al. | | 257/782 |
| 2012/0326290 A1 * | 12/2012 | Andry | G02B 6/4204 | 257/680 |
| 2013/0113117 A1 * | 5/2013 | Haralabidis et al. | | 257/777 |
| 2013/0299982 A1 * | 11/2013 | Pagaila | H01L 21/568 | 257/738 |
| 2014/0070397 A1 * | 3/2014 | Viswanathan | H01L 24/82 | 257/706 |

* cited by examiner

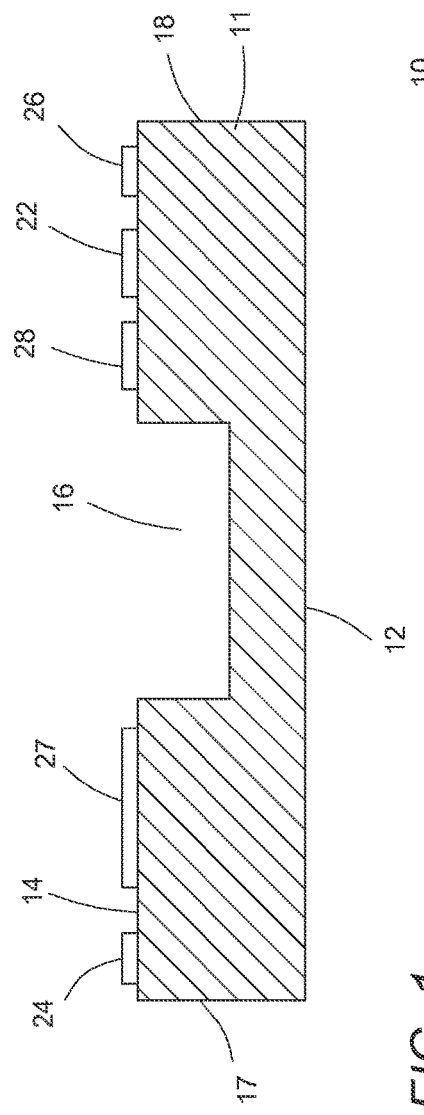
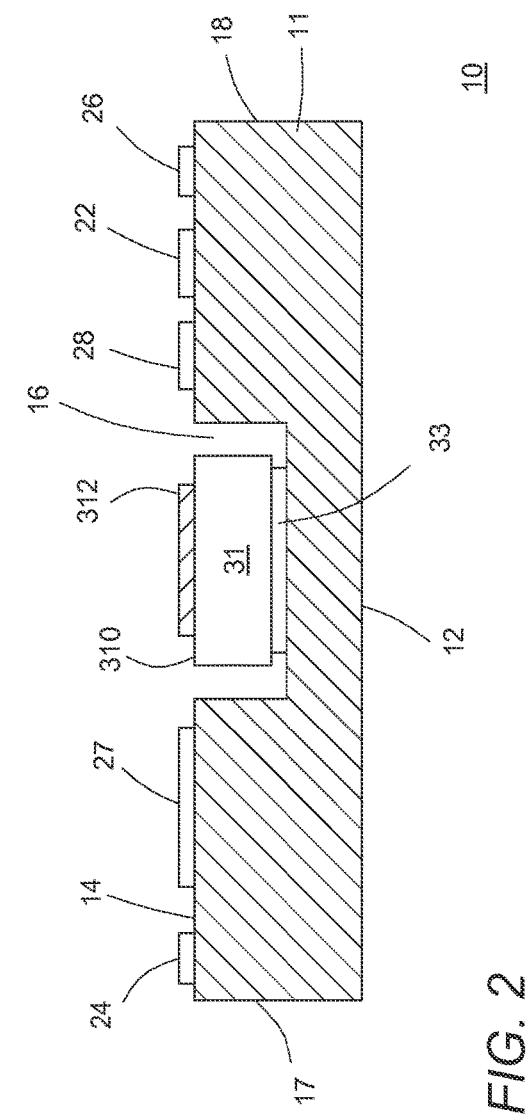

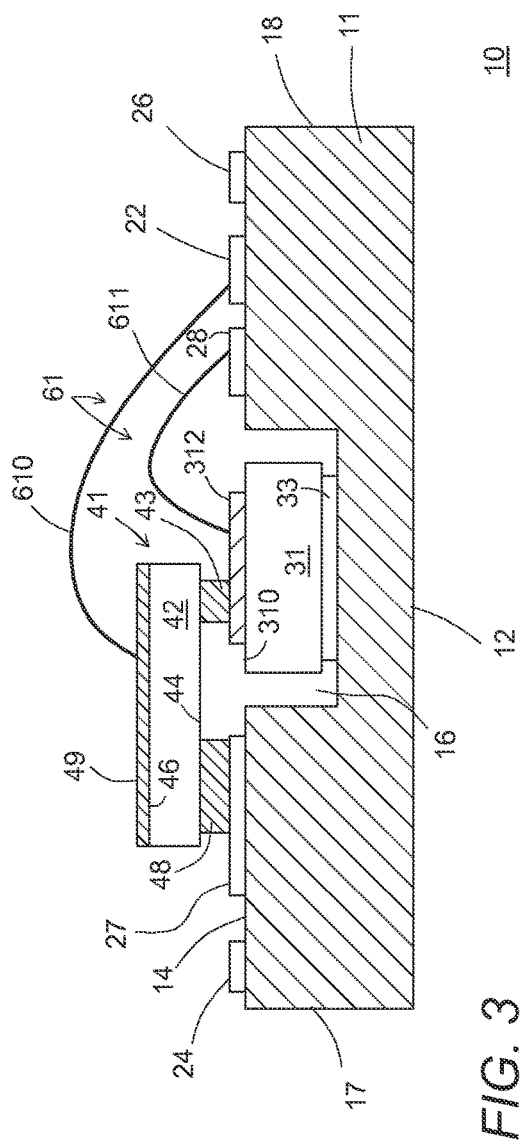
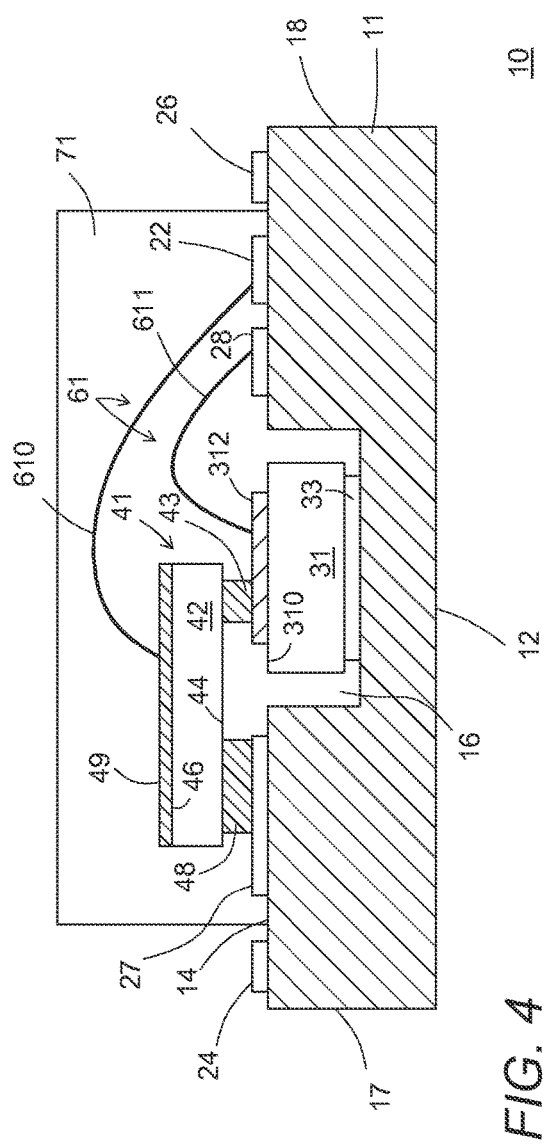
FIG. 3
FIG. 4

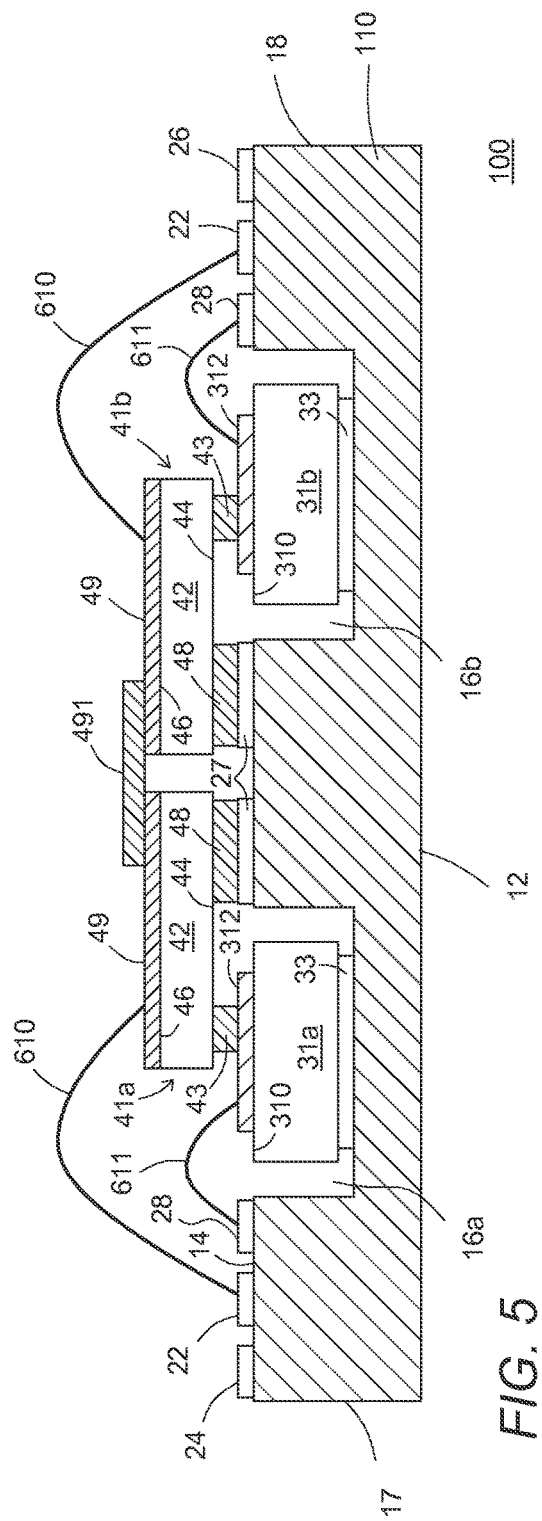
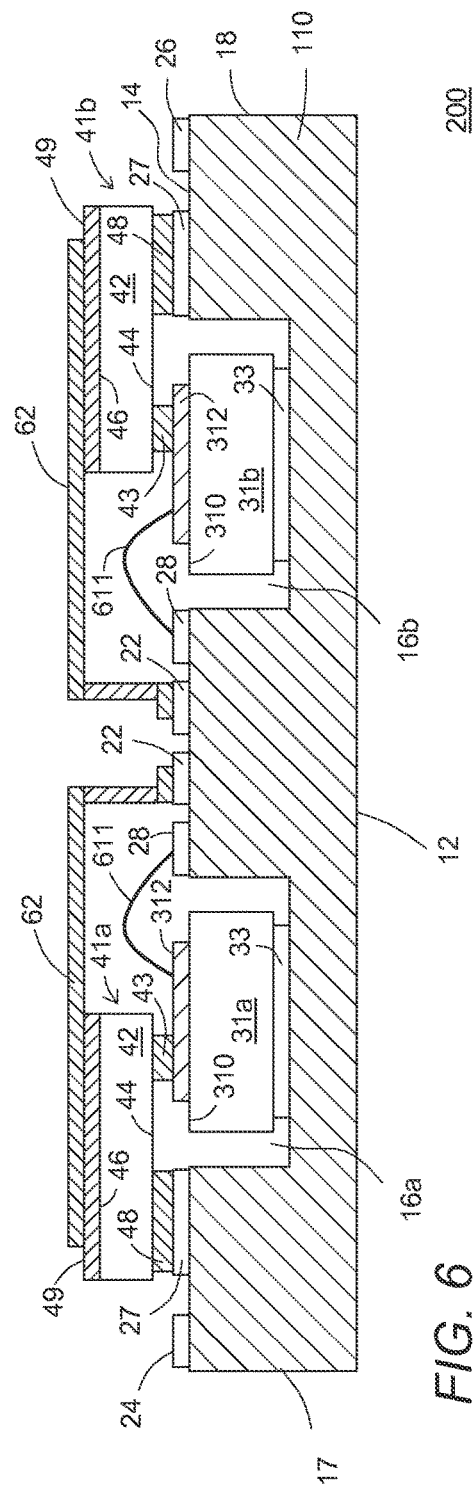
FIG. 5
FIG. 6

SEMICONDUCTOR PACKAGE STRUCTURE AND METHOD

CROSS REFERENCE TO RELATED APPLICATION

This application claims the benefit of U.S. Provisional Application No. 61/588,375 filed Jan. 19, 2012.

BACKGROUND OF THE INVENTION

Embodiments disclosed in the present invention relate generally to electrical technology, and more specifically to a semiconductor component and method of fabricating the same.

Semiconductor component manufacturers are constantly striving to increase the performance of their products. The packaging of semiconductor die may affect the performance of a semiconductor component that includes the semiconductor die. As those skilled in the art are aware, discrete semiconductor devices and integrated circuits are fabricated in wafers, which are then singulated or diced to produce semiconductor die. One or more semiconductor die are placed in a package to protect them from environmental and physical stresses.

The packing of semiconductor die should provide protection, permit transmission of electrical signals to and from the semiconductor die, and permit removal of heat generated by the semiconductor die. However, different packaging structures may increase the parasitic capacitances and inductances in a packaged semiconductor component, which may decrease the frequency of operation of the packaged semiconductor component. Such parasitic effects can be detrimental to the performance of certain semiconductor devices, such as radio frequency (RF) devices. Further, size and space constraints of many applications require that packaged semiconductor die have increased functionality and efficiency in a very small footprint package.

Accordingly, it would be desirable to have a semiconductor package that has improved thermal and electrical characteristics and a method for manufacturing the semiconductor package. It would also be desirable for the semiconductor package to be configurable to support the inclusion of passive and active components, to be size and space efficient, and to reduce parasitic effects.

BRIEF DESCRIPTION OF THE DRAWINGS

FIG. 1 illustrate a cross-sectional view of an embodiment of a substrate at an early stage of fabrication of a semiconductor package structure in accordance with an embodiment of the present invention;

FIG. 2 illustrates a cross-sectional view of the semiconductor package structure after additional processing;

FIG. 3 illustrates a cross-sectional view of the semiconductor package structure after further processing;

FIG. 4 illustrates a cross-sectional view of the semiconductor package structure after still further processing;

FIG. 5 illustrates a cross-sectional view of a semiconductor package structure in accordance with another embodiment of the present invention;

FIG. 6 illustrates a cross-sectional view of a semiconductor package structure in accordance with a further embodiment of the present invention;

Figure 7:
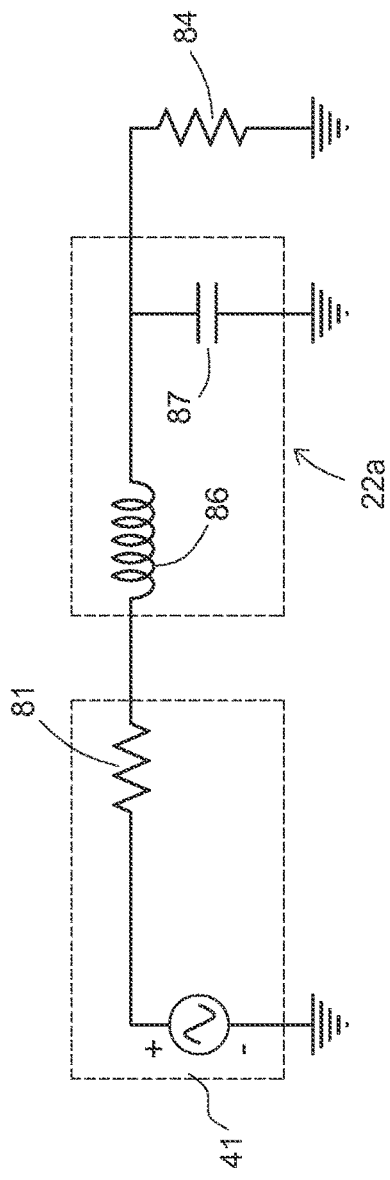
FIG. 7 illustrates a circuit schematic of a passive network for use in an embodiment of the present invention.

For simplicity and clarity of illustration, elements in the figures are not necessarily drawn to scale, and the same reference numbers in different figures denote generally the same elements. Additionally, descriptions and details of well-known steps and elements may be omitted for simplicity of the description. As used herein current-carrying electrode means an element of a device that carries current through the device, such as a source or a drain of an MOS transistor, an emitter or a collector of a bipolar transistor, or a cathode or anode of a diode, and a control electrode means an element of the device that controls current through the device, such as a gate of a MOS transistor or a base of a bipolar transistor.

DETAILED DESCRIPTION OF THE DRAWINGS

FIG. 1 illustrates a cross-sectional view of a semiconductor package structure 10 at an early stage of fabrication in accordance with a first embodiment. In one embodiment, package 10 includes a substrate 11 that has opposing major surfaces 12 and 14, which are generally parallel to each other. Substrate 11 further includes a pair of opposing side surfaces 17 and 18, which can be oriented in a generally perpendicular manner with respect to major surfaces 12 and 14. In one embodiment and not by way of limitation, substrate 11 can have a generally quadrangular shape, such as a square shape or rectangular shape. In another embodiment, substrate 11 can have a multi-sided or a circular shape.

In one embodiment, substrate 11 can be an electrically conductive material (that is, low electrical resistance) and/or a material having a high thermal conductivity (that is, low thermal resistance). In one embodiment, substrate 11 can be a metal. In one embodiment, substrate 11 can be copper, a copper alloy (for example, a copper/tin alloy structure, or a copper/molybdenum/copper layered structure), plated copper (for example, copper with gold plating), or a similar material as known to those of ordinary skill in the art. In one embodiment, substrate 11 can have a thickness from about 500 microns (about 20 mils) to about 1,525 microns (about 60 mils). By way of non-limiting example, substrate 11 can be a flange, a plate, or a leadframe.

In accordance with the present embodiment, substrate 11 further includes one or more well regions 16 that can extend downward or inward from major surface 14 towards major surface 12 as generally illustrated in FIG. 1. In one embodiment, well region 16 can be substantially centrally located within substrate 11. In another embodiment, well region 16 can be offset so that well region 16 is proximate or adjacent to one of opposing side surfaces 17 and 18 of substrate 11. In general, well region 16 has a depth from major surface 14 that is selected so that a major surface of an interposer structure 31 (described in conjunction with FIG. 2) is substantially flush or co-planar with major surface 14 after interposer structure 31 is attached within well region 16. In one embodiment, well region 16 extends to a depth from about 50 microns to about 500 microns. Well region 16 can be formed in substrate 11 by different techniques. In one embodiment, well region 16 may be formed by stamping techniques. In another embodiment, well region 16 may be formed by masking and etching techniques.

In accordance with the present embodiment, a network structure 22 can be placed or formed on major surface 14. In one embodiment, network structure 22 is isolated from substrate 11 using, for example, an insulating material (not shown). In one embodiment, network structure 22 can be an impedance matching network and can include one or more passive components, such as resistors, capacitors, and/or inductors. In one embodiment, network structure 22 is isolated from substrate 11 and includes multiple devices interconnected together on substrate 11. In one embodiment, network structure 22 can be a metal-oxide-semiconductor ("MOS") capacitor or "MOSCAP".

Substrate 11 can further include structures 24, 26, 27, and 28 placed or formed on major surface 14. One or more of structures 24, 26, 27, and/or 28 can be isolated from substrate 11 using, for example, an insulating material (not shown). In one embodiment, structures 24 and 26 can be configured as input/output ("I/O") structures, and can be electrically connected to structures 22, 27, and/or 28 in another plane or on another portion of major surface 14. In one embodiment, structure 27 can be another network structure such as an impedance matching structure similar to network structure 22. In one embodiment, structure 28 can be configured as an intermediate or jumper bond pad structure. In another embodiment, structure 28 can be configured to be another network structure, such as an impedance matching structure. In another embodiment, structure 27 can be configured as an intermediate or jumper bond pad structure. In another embodiment, structure 27 is electrically connected to substrate 11, and substrate 11 can be configured as a current carrying electrode for semiconductor package structure 10. In a further embodiment, other structures can be formed on major surface 12 of substrate 11.

FIG. 2 illustrates a cross-sectional view of semiconductor package structure 10 after additional fabrication. In accordance with the present embodiment, an interposer structure 31 is attached to substrate 11 within well region 16. In general, interposer structure 31 is configured to control the electrical characteristics of another device that can be flip-chip bumped or directly attached to substrate 11 (described in conjunction with FIG. 3), configured to protect the other device, or configured to filter or process electrical signals generated by the other device. By way of example, interposer structure 31 can include passive devices such as, resistors, capacitors, and/or inductors, or active devices such as transistors or integrated circuits.

In one embodiment, interposer structure 31 has a major surface 310 that is substantially flush or co-planar with major surface 14 of substrate 11. A conductive structure 312 can be formed on a portion of major surface 310. Interposer structure 31 can be attached within well region 16 with an insulating attachment layer 33. In another embodiment, interposer structure 31 is configured so that the upper surface of conductive structure 312 is substantially flush or co-planar with major surface 14 of substrate 11. In one embodiment, interposer structure 31 is an active device, such as an integrated circuit ("IC") device, an electrostatic discharge ("ESD") protection device, and/or a discrete active device. In one embodiment, interposer structure 31 can be a gate driver IC device. In one embodiment, interposer structure 31 can include a substrate that contains an insulating layer, and interposer structure 31 can be attached within well region 16 using a conductive attachment layer.

In another embodiment, interposer structure 31 is configured as an ESD device, such as a diode device or similar structure as known by those of ordinary skill in the art. In a further embodiment, interposer structure 31 can be configured as a discrete passive device or an integrated passive device structure. In a still further embodiment, interposer structure 31 can be configured as a ceramic substrate and conductive structure 312 can be configured as a matching network formed on major surface 310. In one embodiment, the matching network can include resistor, capacitor, and/or inductor elements to form, for example, networks suitable for frequency tuning, bandwidth improvement, or modulating gate drive characteristics. In another embodiment, interposer structure 31 can contain an insulating layer and can be attached to well region 16 of substrate 11 using a conductive attachment layer. In another embodiment, interposer structure 31 may constitute a silicon substrate with passive or active elements formed on major surface 310. In another embodiment, interposer structure 31 can be formed of or include a compound semiconductor, such as gallium arsenide (GaAs), gallium nitride (GaN), or similar materials as known to those of ordinary skill in the art.

FIG. 3 illustrates a cross-sectional view of semiconductor package structure 10 after further processing. In accordance with the present embodiment, an electrical device 41 can be attached to a portion of substrate 11 and a portion of interposer structure 31. In one embodiment, electrical device 41 can be flip-chip bumped or directly attached to interposer structure 31 and substrate 11. By directly attached, it is meant that electrical device 41 is attached by a conductive means that minimizes the distance that electrical signals must travel between electrical device 41 and interposer structure 31 and substrate 11. In accordance with the present embodiment, the depth of well region 16 and the resulting generally co-planar configuration between major surfaces 14 and 310 helps facilitate a direct attachment of electrical device 41 to substrate 11 and interposer structure 31 while reducing the overall thickness of semiconductor package structure 10. The structure in accordance with the present embodiment provides improved performance because it eliminates longer interconnect structures, such as long traces or wire bonds between the devices thereby reducing the detrimental parasitic effects associated therewith. Electrical device 41 can also be attached using preformed solder material such as gold/tin. The preformed solder material can be placed on structure 27 to connect with electrode 48 and surface 312 to connect electrode 43. In another embodiment, in order to provide uniform stress relief, a layer of underfill material (not shown) can be provided after the attachment of the flip-chip bumped structures.

In one embodiment, electrical device 41 can be a power semiconductor device. In one embodiment, electrical device 41 can be power transistor device having a control electrode 43 electrically coupled to interposer structure 31. By way of example, electrical device 41 can include a semiconductor substrate 42 having appropriately doped and isolated regions formed on or adjacent a major surface 44. In one embodiment, electrical device 41 includes a current carrying electrode 48 formed adjacent major surface 44, which is flip-chip bumped or directly attached to substrate 11 or structure 27. In one embodiment, structure 27 can be a bond pad or contact pad electrically insulated from substrate 11. In one embodiment, structure 27 can be routed by a conductive trace to another portion of substrate 11. In a further embodiment structure 27 can be electrically connected to substrate 11 with substrate 11 configured as a current carrying electrode for semiconductor package 10.

In one embodiment, electrical device 41 can include another current carrying electrode 49 formed adjacent a major surface 46 of semiconductor substrate 42, which is opposite to major surface 44 of electrical device 41. By way of example, electrical device 41 is configured as a metal oxide semiconductor field effect transistor ("MOSFET") device in which control electrode 43 corresponds to a gate electrode, current carrying electrode 48 corresponds to a source electrode, and current carrying electrode 49 corresponds to a drain electrode. In one embodiment, electrical device 41 is configured as a high frequency (for example, RF frequency) MOSFET device. In another embodiment, current carrying electrode 48 can be attached to interposer structure 31 and control electrode 43 can be attached to substrate 11 or structure 27.

In one embodiment, control electrode 43 and current carrying electrode 48 can be electroplated or deposited bump structures that include solderable conductive materials. By way of example, lead/tin bumps, gold bumps, tin/silver bumps, tin/silver/copper bumps, or other similar materials as known by those of ordinary skill in the art can be used. In one embodiment, current carrying electrode 49 can be a solderable conductive material, such as aluminum, an aluminum alloy, chrome/nickel/gold, titanium/nickel/silver, or other similar materials as known by those of ordinary skill in the art.

Figure 9:
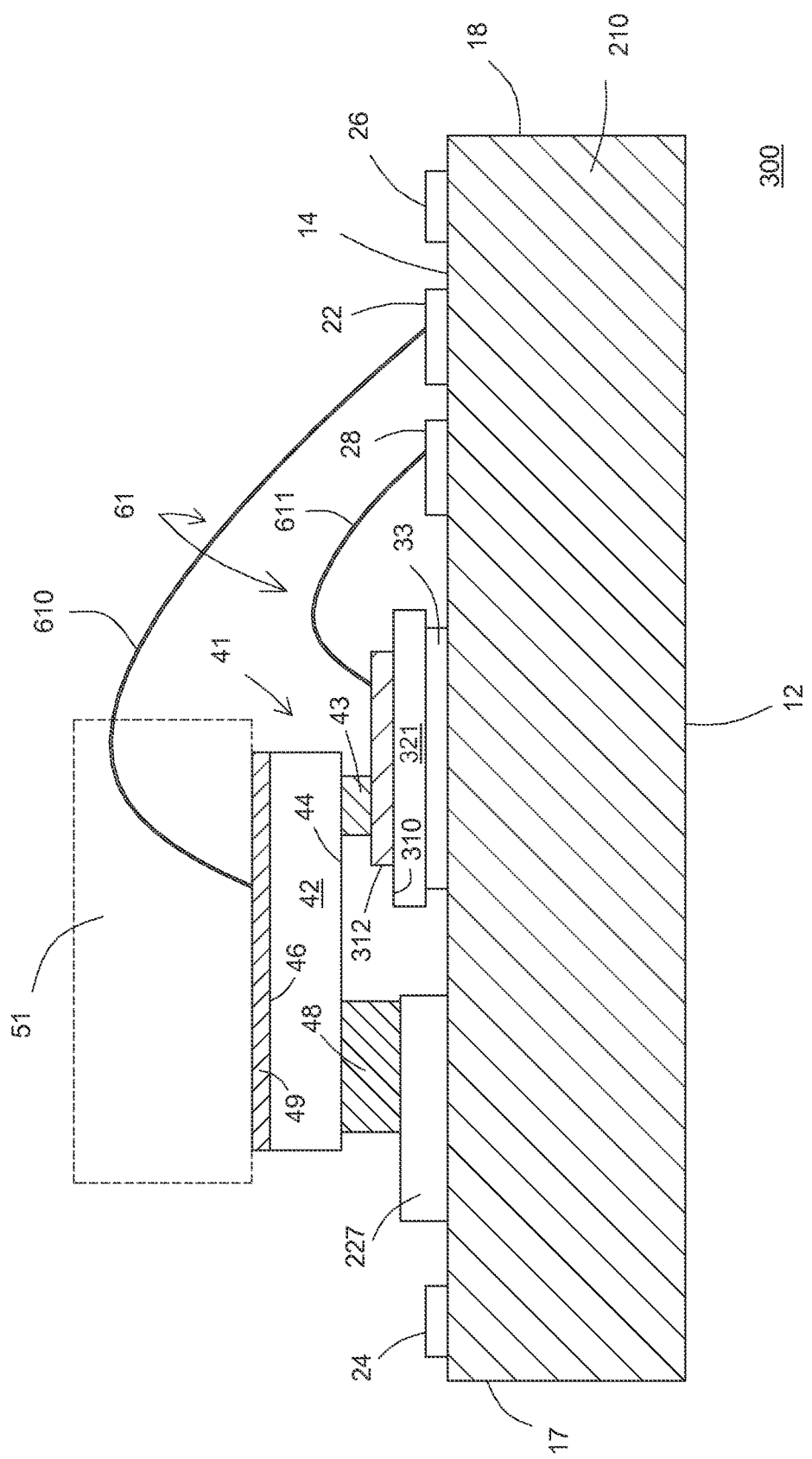
FIG. 9 illustrates a cross-sectional view of a semiconductor package structure in accordance with a still further embodiment of the present invention.

FIG. 3 further illustrates conductive connective structures 61, which can be used to electrically connect portions of electrical device 41 and interposer structure 31 to portions of substrate 11 and/or structures formed thereon. In one embodiment, connective structures 61 includes wire bond 610 that connects current carrying electrode 49 to network structure 22 and wire bond 611 that connects in interposer structure 31 to structure 28. In another embodiment, connective structures 61 can include clips or straps or a combination of clips, straps and wire bonds. In accordance with the present embodiment, connective structures 61 are configured to reduce series resistance and inductance. In another embodiment, another electrical device (such as electrical device 51 as generally illustrated in FIG. 9) can be attached directly to current carrying electrode 49.

FIG. 4 illustrates a cross-sectional view of semiconductor package structure 10 after further processing. In one embodiment, an optional encapsulating layer 71 can be formed over portions of substrate 11 while leaving other portions of substrate 11 such as, I/O's 24 and 26 exposed to allow for connections to other devices. In one embodiment, encapsulating layer 71 can be an epoxy resin molding compound and can be formed using, for example, cavity molding techniques. In one embodiment, encapsulating layer 71 covers electrical device 41, interposer structure 31, conductive connective structures 61, and structures 22, 27, and 28. In one embodiment, structures 24 and 26 can be exposed along major surface 14 of substrate 11 to allow for connection to a next level of assembly. Although not shown, it is contemplated that other connective structures can be used to form I/O's including through-vias formed in substrate 11 with I/O's balls or pads formed along major surface 12 of substrate 11. Another advantage of the present embodiment is that by placing current carrying electrode 48 adjacent to substrate 11, substrate 11 can carry away heat generated by electrical device 41 in a more efficient manner. That is, substrate 11 can be configured as both a current carrying electrode as well as to provide a thermal path to remove heat away from electrical device 41 in an efficient manner.

Referring now to FIG. 5, there is illustrated a semiconductor package structure 100 in accordance with another embodiment. Semiconductor package structure 100 is similar to semiconductor package structure 10, with a primary distinction being that substrate 110 in semiconductor package 100 includes more than one well region 16, which are generally illustrated as well regions 16a and 16b. Specifically, semiconductor package 100 is configured to include more than one interposer structure 31, and more than one electrical device 41, which are generally illustrated as interposer structures 31a and 31b and electrical devices 41a and 41b. In one embodiment, a conductive interconnect structure 491 can be used to electrically connect current carrying electrode 49 of electrical device 41a to current carrying electrode 49 of electrical device 41b. In one embodiment, if electrical device 41 is a MOSFET, the conductive interconnect structure 491 can connect the drain electrodes together.

It is contemplated that semiconductor package 100 can include multiple interposer structures 31 and multiple electrical devices 41. It is further contemplated that the interposer structures 31a and 31b in semiconductor package structure 100 can be configured to perform different functions or they can be configured to perform the same function. For example, interposer structure 31a can be configured as a matching network structure, and interposer structure 31b can be configured as a gate driver IC. In one embodiment, current carrying electrodes 48 of both electrical devices 41a and 41b can be adjacent to each other in a substantially centrally located portion of substrate 110. In an optional embodiment, structure 100 can include an encapsulating layer covering portions thereof.

Referring now to FIG. 6, there is illustrated a semiconductor package structure 200 in accordance with a further embodiment. Semiconductor package structure 200 is similar to semiconductor package structure 100, with a primary distinction being that in semiconductor package 200, electrical devices 41a and 41b are oriented such that current carrying electrodes 48 are placed adjacent opposed side surfaces 17 and 18 of substrate 110. In addition, semiconductor package 200 includes conductive connective clip structures 62 that electrically connect current carrying electrodes 49 to network structures 22. In an optional embodiment, structure 200 can include an encapsulating layer covering portions thereof.

FIG. 7 illustrates a circuit schematic for an impedance matching network 22a for use in an embodiment. Network 22a is a non-limiting example of an impedance matching structure 22 that can be formed on or as part of interposer structure 31 illustrated in FIGS. 1-6. Electrical device 41 is illustrated as electrically connected to network 22a through generator output impedance 81. During impedance matching, a specific electronic load resistance 84 is made to match generator output impedance 81 for maximum power transfer. The need for impedance matching arises in virtually all electronic circuits, especially in RF circuit design. Network 22a is illustrated as a low pass L-network, which is a simple inductor 86 and capacitor 87 (LC) circuit useful to attenuate harmonics, noise, and other undesired signals. The primary applications of L-networks involve impedance matching in RF circuits, transmitters, and receivers. L-networks are useful in matching one amplifier output to the input of a following stage. Another use is matching an antenna impedance to a transmitter output or a receiver input.

Figure 8:
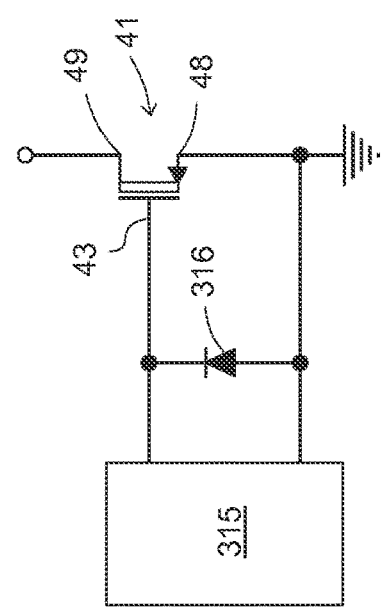
FIG. 8 illustrates a circuit diagram of a gate driver device and an electrostatic discharge ("ESD") device for use in an embodiment of the present invention.

FIG. 8 illustrates a circuit diagram of a gate driver IC 315 electrically connected to control electrode 43 of electrical device 41. Gate driver IC 315 is illustrated as a non-limiting example of an interposer structure 31 in FIGS. 2-6 and 9. In another embodiment, an ESD structure 316 can be used to protect control electrode 43. In one embodiment, ESD structure 316 can be a diode device. ESD structure 316 is illustrated as another non-limiting example of an interposer structure 31 in FIGS. 2-6 and 9.

FIG. 9 illustrates a cross-sectional view of a semiconductor package structure 300 in accordance with a still further embodiment. In one embodiment, semiconductor package structure 300 includes a substrate 210 that is similar to substrate 11 except that substrate 210 is configured without a well region. In accordance with the present embodiment, electrical device 41 can be attached to a conductive pad 227 and a prescribed portion of an interposer structure 321. In one embodiment, interposer structure 321 is configured as an active device. In one embodiment, interposer structure 321 can be a gate driver integrated circuit semiconductor device. In this embodiment, interposer structure 321 is configured to be a very-thin-die device having a thickness of less than about 75 microns. In one embodiment, interposer structure 321 can be an ultra-thin-die device having a thickness of less than about 50 microns. In accordance with the present embodiment, conductive pad 227 is configured to have a thickness that facilities a generally planar attachment of electrical device 41 to substrate 210 and device driver structure 321.

In one embodiment, electrical device 41 can be attached to a prescribed bond pad or connection structure on interposer structure 321. In one embodiment, electrical device 41 can be flip-chip bumped or directly attached to interposer structure 321 and conductive pad 227. By directly attached, it is meant that electrical device 41 is attached by a conductive means that minimizes the distance that electrical signals must travel between electrical device 41 and interposer structure 321 and substrate 210. In accordance with the present embodiment, the reduced thickness of interposer structure 321 helps facilitate a direct attach attachment of electrical device 41 to substrate 211/conductive structure 227 and interposer structure 321 while reducing the overall thickness of semiconductor package structure 300.

In an alternative embodiment, another electrical device 51 such as a semiconductor device can be attached directly to current carrying electrode 49 as generally illustrated in phantom in FIG. 9. As illustrated, electrical device 51 can be attached to a surface of electrical device 41 that is opposite to or away from substrate 210. Electrical device 51 can be attached using, for example, a conductive adhesive, solder paste, or similar materials as known to those of skill in the art.

From all of the foregoing, one skilled in the art can determine that according to one embodiment, a semiconductor package structure (for example, elements 10, 100, 200) includes a substrate (for example, elements 11, 110) having a well region (for example, element 16, 16a, 16b) extending from a first major surface (for example, element 14). An interposer structure (for example, element 31, 31a, 31b, 315, 316) is attached to the substrate within the well region. An electrical device (for example, element 41, 41a, 41b) is attached to the interposer and the substrate.

Those skilled in the art will also appreciate that according to another embodiment, the structure can further include an impedance network structure (for example, elements 22, 22a) on another portion of the substrate, and the electrical device can be electrically coupled (for example, elements 61, 610, 62) to the impedance network structure.

Those skilled in the art will also appreciate that according to another embodiment, a package structure (for example, elements 10, 100, 200) includes a substrate (for example, elements 11, 110) having a first well region (for example, elements 16, 16a) extending from a major surface (for example, element 14) of the substrate. A first interposer structure (for example, elements 31, 31a) is attached to the substrate within the first well region, wherein the first interposer structure has a major surface (for example, elements 310, 312) that is substantially co-planar with the major surface of the substrate. A first electrical device (for example, elements 41, 41a) is attached to the substrate and the first interposer structure.

Those skilled in the art will also appreciate that according to another embodiment, the structure can further include a second interposer structure (for example, elements 31, 31b) attached to the substrate in a second well region (for example, elements 16, 16b) extending from a major surface of the substrate. A second electrical device (for example, elements 41, 41b) is attached to the substrate and second interposer structure.

Those skilled in the art will also appreciate that according to still another embodiment, a method for forming a semiconductor package structure (for example, elements 10, 100, 200) includes providing a substrate (for example, elements 11, 110) having a well region (for example, elements 16, 16a, 16b) extending from a major surface (for example, element 14). The method includes attaching an interposer structure (for example, elements 31, 31a, 31b) to the substrate within the well region. The method includes attaching an electrical device (for example, elements 41, 41a, 41b) to the substrate and the interposer structure.

Those skilled in the art will also appreciate that according to a further embodiment, an electronic package structure (for example, elements 10, 100, 200, 300) comprise a substrate (for example, elements 11, 110, 210) having a major surface (for example, element 14). An interposer structure (for example, elements 31, 31a, 31b, 321) is attached to the substrate. An electrical device (for example, element 41, 41a, 41b) having a first electrode (for example, element 43) is attached to the interposer structure and a second electrode (for example, element 48) attached to the substrate.

Those skilled in the art will also appreciate that according to a still further embodiment, the structure can also include a well region (16, 16a, 16b), and the electrical device can be attached to the substrate within the well region.

Those skilled in the art will also appreciate that according to yet another embodiment, in the structures described herein, the interposer structure can comprise one or more passive devices (for example, element 22a) or an active device, such as a gate driver device (for example, element 315), or an ESD device (for example, element 316).

In view of all the above, it is evident that a novel structure and method is disclosed. Included in one embodiment, among other features, is a substrate having at least one well region extending from a major surface. An interposer structure is attached to the substrate within the well region and an electrical device is directly attached to the interposer structure and the substrate. In one embodiment, the interposer structure can be an active device, such as a gate driver IC or an ESD structure. In another embodiment, the interposer structure can be a passive device, such as an impedance matching network. Other structures, such as impedance matching networks can be included on other portions of the substrate. The structure and method increases design flexibility and provides for a package structure with a smaller footprint. The structure and method also reduces parasitic effects thereby improving electrical performance. The structure and method further provides improve heat transfer characteristics.

While the subject matter of the invention is described with specific preferred embodiments and example embodiments, the foregoing drawings and descriptions thereof depict only typical embodiments of the subject matter, and are not therefore to be considered limiting of its scope. It is evident that many alternatives and variations will be apparent to those skilled in the art. For example, the subject matter has been described for a particular n-channel MOSFET structure, although the method and structure is directly applicable to other MOS transistors, as wells as bipolar, BiCMOS, metal semiconductor FET's (MESFETs), HFETs, thyristors bi-directional transistors, and other transistor structures.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention, and form different embodiments, as would be understood by those skilled in the art.

We claim:

1. A semiconductor package structure comprising:
a substrate having a first well region extending from a first major surface, the first major surface defining a generally horizontal plane;
a first interposer structure attached to the substrate within the first well region below the generally horizontal plane; and
a first electrical device comprising a power semiconductor device, the power semiconductor device having a control electrode and a first current carrying electrode on a first surface and a second current carrying electrode on a second surface opposite to the first surface, wherein:
the first surface faces and overlaps the first interposer and faces and overlaps the substrate adjacent the first well region,
the control electrode is attached to the first interposer structure,
the first current carrying electrode is attached to the substrate along the generally horizontal plane, and
the second current carrying electrode is above the generally horizontal plane and electrically coupled to the substrate.

2. The structure of claim 1 further comprising an impedance network structure on another portion of the substrate, and wherein the first electrical device is electrically coupled to the impedance network structure.

3. The structure of claim 1, wherein the first interposer structure has a major surface that is substantially co-planar with the first major surface.

4. The structure of claim 1, wherein the substrate comprises a material having low electrical resistance and low thermal resistance.

5. The structure of claim 4, wherein the substrate comprises a metal plate.

6. The structure of claim 1, wherein the first interposer structure comprises an active device.

7. The structure of claim 6, wherein the first interposer structure comprises an integrated circuit.

8. The structure of claim 6, wherein the first interposer structure comprises an electrostatic discharge device.

9. The structure of claim 1, wherein the first interposer structure comprises a ceramic substrate having a passive device on a major surface.

10. The structure of claim 1, wherein the second current carrying electrode is electrically coupled to an impedance matching network on the substrate.

11. The structure of claim 1 further comprising an encapsulating layer covering the first interposer structure, the first electrical device, and at least portions of the substrate.

12. The structure of claim 1, further comprising:
a second well region extending from the first major surface and spaced apart from the first well region;
a second interposer structure attached to the substrate in the second well region; and
a second electrical device having a first surface attached to the substrate and second interposer structure and a second surface opposite to the first surface of the second electrical device, wherein the second surface of the second electrical device is electrically coupled to the second current carrying electrode of the first electrical device.

13. A package structure comprising:
a substrate having a first well region extending from a major surface;
a first interposer structure attached to the substrate within the first well region, wherein the first interposer structure has a major surface substantially co-planar with the major surface of the substrate; and
a first electrical device comprising a power semiconductor device having a control electrode and a first current carrying electrode on a first surface and a second current carrying electrode on a second surface opposite to the first surface, wherein:
the first surface faces the first interposer structure and the substrate,
the control electrode is attached to the first interposer structure,
the first current carrying electrode is attached to the substrate outside of any well region, and
the second current carrying electrode is electrically coupled to the substrate with a conductive connective structure.

14. The structure of claim 13, wherein the substrate includes a second well region extending from the major surface and spaced apart from the first well region, wherein the structure further comprises:
a second interposer structure attached to the substrate in the second well region; and
a second electrical device attached to the substrate and second interposer structure.

15. The structure of claim 14, wherein the first interposer structure is configured for a first function, and wherein the second interposer structure is configured for a second function different than the first function.

16. The structure of claim 15, wherein the first interposer structure is configured as a passive device, and wherein the second interposer structure is configured as an active device.

17. The structure of claim 13 further comprising an impedance matching network on another portion of the substrate, wherein the second current carrying electrode is electrically coupled to the impedance matching network.

18. The structure of claim 14, wherein the first electrical device is flip-chip bump attached to the substrate and the first interposer structure, the structure further comprising a conductive interconnect structure coupling the first electrical device to the second electrical device.

19. A method for forming a semiconductor package structure comprising the steps of:
providing a substrate having a first well region extending from a major surface;
attaching a first interposer structure to the substrate within the first well region;

providing a first electrical device comprising a power semiconductor device having a control electrode and a first current carrying electrode on a first surface and a second current carrying electrode on a second surface opposite to the first surface;

attaching the control electrode to the first interposer structure;

attaching the first current carrying electrode to the substrate outside of the first well region; and electrically coupling the second current carrying electrode to the substrate with a conductive connective structure.

20. The method of claim 19, wherein:

providing the substrate includes providing the substrate having a second well region extending from the major surface;

attaching a second interposer structure to the substrate within the second well region; and attaching a second electrical device to the substrate and the second interposer structure.

21. The method of claim 19, wherein attaching the control electrode comprises flip-chip bump attaching the control electrode to the first interposer structure, and wherein providing the substrate includes providing the substrate further including an impedance matching network on the major surface, and wherein attaching the first interposer structure includes attaching an active device, and wherein electrically coupling the second current carrying electrode comprises electrically coupling the second current carrying electrode to the impedance matching network.

22. An electronic package structure comprising:

a substrate having a major surface, wherein the substrate is a conductive plate consisting of one or more materials each having a low electrical resistance and a low thermal resistance;

a first semiconductor device attached to the substrate; and a second semiconductor device having a first electrode and a second electrode on a first surface and a third electrode on a second surface opposite to the first surface, wherein the second semiconductor device overlaps the first semiconductor device, and wherein the first electrode is attached to the first semiconductor device, the second electrode is attached to the substrate, and the third electrode is electrically coupled to the substrate with a conductive connective structure.

23. The structure of claim 22, wherein the first semiconductor device comprises a gate driver device and the second semiconductor device comprises a power semiconductor device.

24. The structure of claim 22, wherein the substrate includes a first well region extending from the major surface, and wherein the first semiconductor device is attached to the substrate within the first well region, the structure further comprising:

a second well region extending from the major surface;

a third semiconductor device within the second well region; and a fourth semiconductor device having a fourth electrode attached to the third semiconductor device, a fifth electrode attached to the substrate, and a sixth electrode electrically coupled to the substrate and the third electrode.

25. The structure of claim 22, wherein the first electrode is flip-chip bump attached to the first semiconductor device and the second electrode is flip-chip bump attached to the substrate.

* * * * *